United States Patent
Li et al.

(10) Patent No.: US 9,236,575 B1
(45) Date of Patent: Jan. 12, 2016

(54) DYNAMIC ALIGNMENT BY ELECTRICAL POTENTIAL AND FLOW CONTROL TO SINGLE-WALL CARBON NANOTUBE FIELD EFFECT TRANSISTORS

(71) Applicant: GLOBALFOUNDRIES INC., Grand Cayman (KY)

(72) Inventors: Wai-Kin Li, Hopewell Junction, NY (US); Hanfei Wang, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/478,115

(22) Filed: Sep. 5, 2014

(51) Int. Cl.
  H01L 51/30 (2006.01)
  H01L 51/40 (2006.01)
  H01L 51/05 (2006.01)
  H01L 51/00 (2006.01)
  H01L 51/10 (2006.01)

(52) U.S. Cl.
  CPC ........ H01L 51/0541 (2013.01); H01L 51/0012 (2013.01); H01L 51/0048 (2013.01); H01L 51/0093 (2013.01); H01L 51/107 (2013.01); H01L 51/004 (2013.01)

(58) Field of Classification Search
  None
  See application file for complete search history.

(56) References Cited

U.S. PATENT DOCUMENTS

| | | | |
|---|---|---|---|
| 6,616,497 B1 | 9/2003 | Choi et al. | |
| 6,790,425 B1 | 9/2004 | Smalley et al. | |
| 7,048,999 B2 | 5/2006 | Smalley et al. | |
| 7,595,150 B2 | 9/2009 | Hyde et al. | |
| 2007/0207182 A1 | 9/2007 | Weber et al. | |
| 2008/0020487 A1 | 1/2008 | McLean et al. | |
| 2009/0233001 A1* | 9/2009 | Smits | B82Y 30/00 427/458 |
| 2011/0168983 A1* | 7/2011 | Mo | B82Y 10/00 257/40 |
| 2012/0135158 A1* | 5/2012 | Freer | B82Y 10/00 427/532 |

FOREIGN PATENT DOCUMENTS

WO 2007033283 A2 3/2007
WO 2010140821 A3 9/2010

OTHER PUBLICATIONS

Lu, et al., "DNA Functionalization of Carbon Nanotubes for Ultrathin Atomic Layer Deposition of High κ Dielectrics for Nanotube Transistors with 60 mV/Decade Switching", J. Am. Chem. Soc., Mar. 1, 2006, pp. 3518-3519, vol. 128, No. 11.

(Continued)

Primary Examiner — Khaja Ahmad
(74) Attorney, Agent, or Firm — Scully, Scott, Murphy & Presser, P.C.

(57) ABSTRACT

After forming a plurality of metal anchors arranged in a matrix of rows and columns and a plurality trenches separating adjacent rows of metal anchors on a substrate, a dispersion comprising charged single-wall carbon nanotubes (SWCNTs) having a surface binding group on each end of the charged SWCNTs is directed to flow through the plurality of trenches. During the flow process, one end of each of the charged SWCNTs binds to a corresponding metal anchor through a surface binding group. An electric field is then applied to align the charged SWCNTs parallel to lengthwise directions of the plurality of trenches such that another end of the each of the SWCNTs binds to an adjacent metal anchor through another surface binding group. The aligned charged SWCNTs can be used as conducting channels for field effect transistors (FETs).

20 Claims, 12 Drawing Sheets

(56) References Cited

OTHER PUBLICATIONS

Zheng, et al., "DNA-assisted dispersion and separation of carbon nanotubes", Nature Materials, May 2003, pp. 338-342, vol. 2.

Poirier, "Characterization of Organosulfur Molecular Monolayers on Au(111) using Scanning Tunneling Microscopy", Chemical Reviews, Apr. 1997, pp. 1117-1127, vol. 97, No. 4, American Chemical Society.

Weizmann, et al., DNC-CNT Nanowire Networks for DNA Detection, Journal of the American Society, Feb. 22, 2011, pp. 3238-3241, vol. 133.

Kelley, et al., "Orienting DNA Helices on Gold Using Applied Electric Fields", Langmuir; The ACS Journal of Surfaces and Colloids, Nov. 24, 1998, pp. 6781-6784, vol. 14, No. 24.

Zangmeister, et al., Adsorption Behavior of DNA-Wrapped Carbon Nanotubes on Self-Assembled Monolayer Surfaces, Langmuir, Mar. 14, 2007, pp. 6252-6256, vol. 23, No. 11.

* cited by examiner

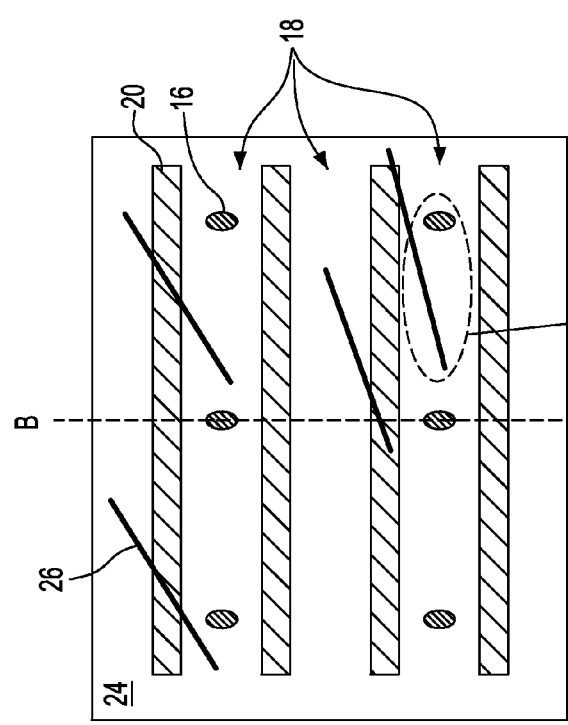
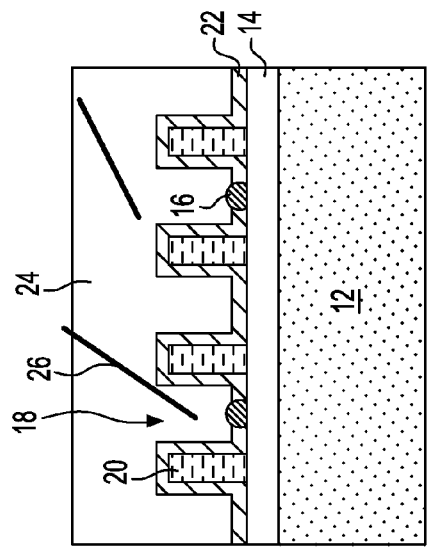
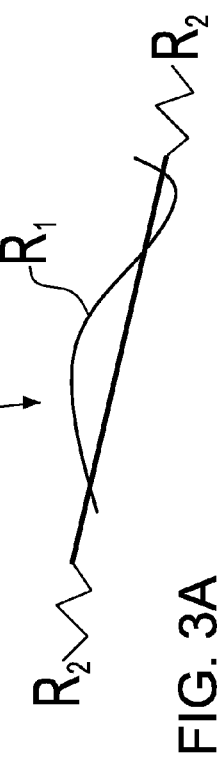
$R_1$ = charged moieties
$R_2$ = surface binding group
FIG. 3A
FIG. 3B

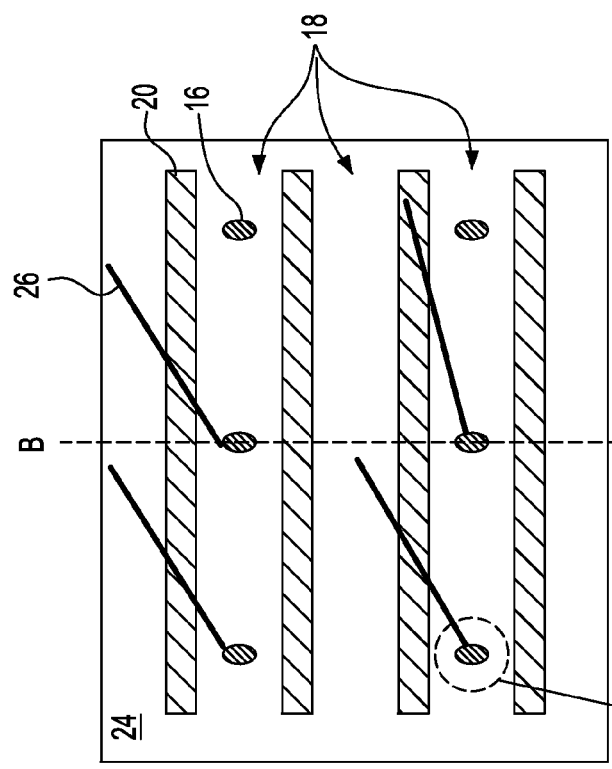
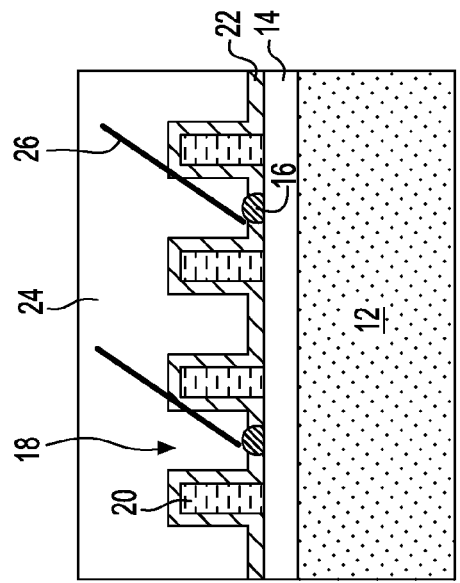
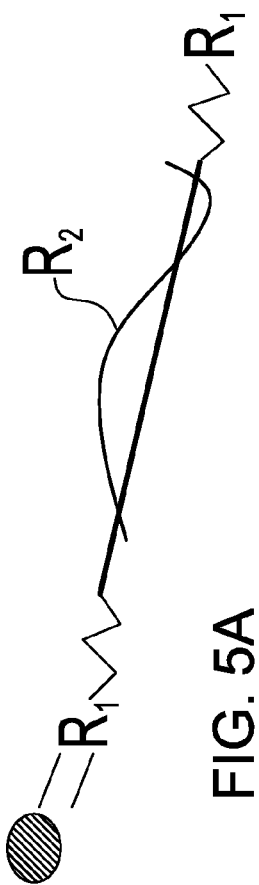
FIG. 5B
FIG. 5A
$R_1$ = charged moieties
$R_2$ = surface binding group

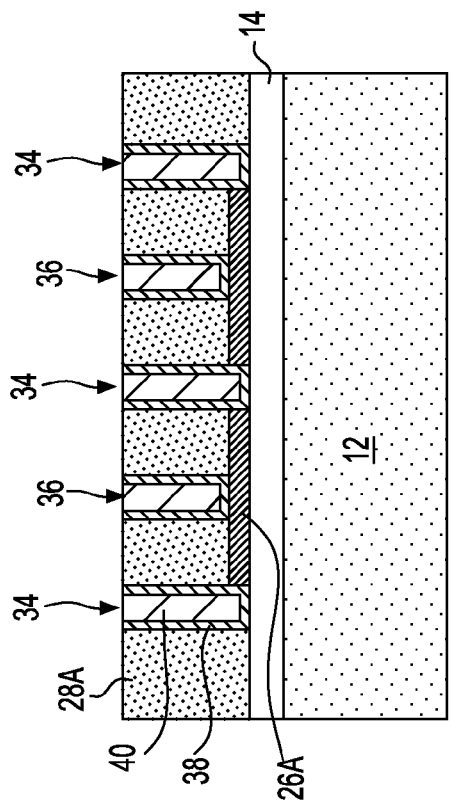
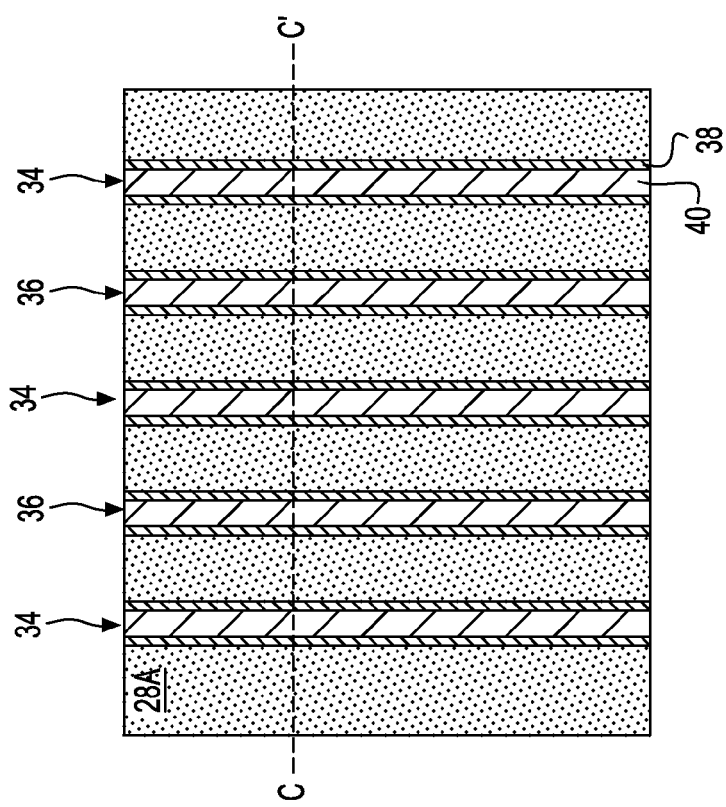
FIG. 11B
FIG. 11A

DYNAMIC ALIGNMENT BY ELECTRICAL POTENTIAL AND FLOW CONTROL TO SINGLE-WALL CARBON NANOTUBE FIELD EFFECT TRANSISTORS

BACKGROUND

The present application relates to semiconductor device fabrication, and more particularly, to a method of dynamically aligning single-wall carbon nanotubes for fabricating carbon nanotube field effect transistors.

The use of single-wall carbon nanotubes (SWCNTs) as conducting channels for field effect transistors (FETs) has been extensively studied in recent years. SWCNT FETs offer many advantage over conventional silicon-based FETs since the one-dimensional structure of the SWCNTs allows the SWCNT based FETs to be aggressively scaled without incurring deleterious short-channel effects that hinder modern scaled devices.

In SWCNT FETs, the alignment of SWCNTs is a fundamental requirement to ensure their excellent functions. Individual SWCNTs have been aligned and positioned between a source electrode and a drain electrode using atomic force microscope (AFM). However, this approach is often inefficient and tedious. Therefore, there remains a need to develop an effective method to align and position SWCNTs in a massive scale for device applications.

SUMMARY

The present application provides a method for dynamically aligning single-wall carbon nanotubes (SWCNTs) for fabricating field effect transistors. After forming a plurality of metal anchors arranged in a matrix of rows and columns and a plurality trenches separating adjacent rows of metal anchors on a substrate, a dispersion comprising charged SWCNTs having a surface binding group on each end of the charged SWCNTs is directed to flow through the plurality of trenches. During the flow process, one end of each of the charged SWCNTs binds to a corresponding metal anchor through a surface binding group. An electric field is then applied to align the charged SWCNTs parallel to lengthwise directions of the plurality of trenches such that another end of the each of the SWCNTs binds to an adjacent metal anchor through another surface binding group. The aligned charged SWCNTs can be used as conducting channels for field effect transistors (FETs).

In one aspect of the present application, a method of forming a semiconductor structure is provided. The method of forming a semiconductor structure includes first forming a plurality of metal anchors and a plurality of trenches on a substrate. The plurality of metal anchors are arranged in a matrix of rows and columns such that the metal anchors in each row are arranged in a corresponding trench along a lengthwise direction of the corresponding trench. A dispersion comprising a plurality of charged single-wall carbon nanotubes (SWCNTs) having a surface binding group on each end of the plurality of charged SWCNTs is then directed through the plurality of trenches, during which one end of each of the plurality of charged SWCNTs binds to a corresponding metal anchor. Next, the plurality of charged SWCNTs is subjected to an electric field. The electric field aligns the plurality of charged SWCNTs parallel to lengthwise directions of the plurality of trenches such that another end of each of the plurality of charged SWCNTs binds to a metal anchor adjacent to the corresponding metal anchor.

BRIEF DESCRIPTION OF THE DRAWINGS

FIG. 3A is a top view of the semiconductor structure of FIG. 2A after directing a dispersion containing charged SWCNTs having charged moieties on sidewalls and surface binding groups at opposite ends through the trenches.

FIG. 3B is a cross-sectional view of the semiconductor structure of FIG. 3A along line B-B'.

FIG. 5A is a top view of the semiconductor structure of FIG. 3A after binding a surface binding group at one end of the charged SWCNTs to the metal anchors.

FIG. 5B is a cross-sectional view of the semiconductor structure of FIG. 5A along line B-B'.

FIG. 11A is a top view of the semiconductor structure of FIG. 10A after forming a first gate structure in each of first openings and a second gate structure in each of second openings.

FIG. 11B is a cross-sectional view of the semiconductor structure of FIG. 11A along line C-C'.

DETAILED DESCRIPTION

Figure 1B:
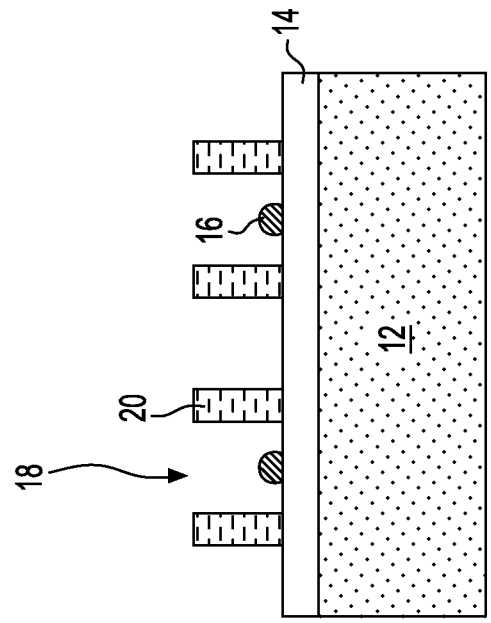
FIG. 1B is a cross-sectional view of the semiconductor structure of FIG. 1A along line B-B'.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
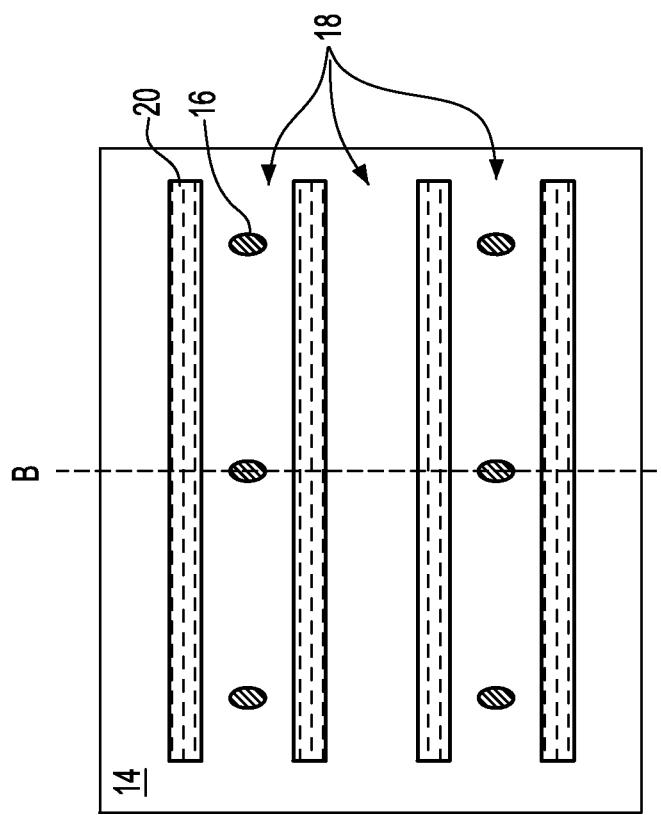
FIG. 1A is a top view of an exemplary semiconductor structure including a substrate on which a plurality of metal anchors and a plurality of trenches are formed in accordance with one embodiment of the present application.

Referring to FIGS. 1A and 1B, there is illustrated an exemplary semiconductor structure in accordance with one embodiment of the present application which includes a plurality of metal anchors 16 and a plurality of trenches 18 formed on a substrate.

In one embodiment and as shown in FIG. 1B, the substrate includes a base substrate 12 and a first insulating layer 14 formed on the base substrate 12. The base substrate 12 may be composed of any suitable semiconductor material, such as, for example, Si, Ge, SiGe, SiC, SiGeC, and III/V compound semiconductors including InAs, GaAs, and InP. In one embodiment, the base substrate 12 is comprised of Si. The base substrate 12 provides mechanical support for the rest of the components in the semiconductor structure. The thickness of the base substrate 12 can be from 400 μm to 1,000 with a thickness from 50 μm to 900 μm being more typical.

The first insulating layer 14 may include any electrically insulating material. In one embodiment, the first insulating layer 14 includes a dielectric oxide such as for example, silicon oxide, hafnium oxide and aluminum oxide.

The metal anchors 16 can be formed by first depositing a metal layer (not shown) over the first insulating layer 14 by a conventional deposition technique including, but not limited to, a chemical vapor deposition (CVD), sputtering, and physical vapor deposition (PVD). The metal layer that is formed can have a thickness ranging from 10 nm to 100 nm, although lesser and greater thicknesses can also be employed. The metal layer may include any metal that can guide the alignment of the charged SWCNTs of the present application. Exemplary metals that can be employed as the metal layer include, but are not limited to gold, silver, copper, chromium, aluminum, titanium, tungsten, and platinum.

The metal layer can be subsequently patterned to form the metal anchors 16 by lithography and etching processes. The lithographic step includes applying a photoresist (not shown) on the metal layer, exposing the photoresist to a desired pattern of radiation, and developing the exposed photoresist utilizing a conventional resist developer. The etching process comprises dry etch and/or wet chemical etch. Suitable dry etching processes that can be used in the present application include reactive ion etch (RIE), ion beam etching, plasma etching or laser ablation. Typically, a RIE process is used. The etching process transfers the pattern from the patterned photoresist to the metal layer utilizing the insulating layer 14 as an etch stop. After transferring the pattern into the metal layer, the residual photoresist can be removed utilizing a conventional resist stripping process such as, for example, ashing. The metal layer is patterned into a matrix of rows and columns for aligning the charged SWCNTs of the present application. In one embodiment, the metal layer is patterned as dots. Adjacent metal anchors in each row may be separated by a pitch ranging from 50 nm to 200 nm, which corresponds to a length of each of the charged SWCNTs.

A second insulating layer (not shown) is then deposited over the first insulating layer 14 and the metal anchors 16 by a conventional deposition process such as, for example, CVD, PVD or spin coating. The material of the second insulating layer can be, for example, a dielectric material or a non-conductive polymer. In some embodiments, the second insulating layer may include a same dielectric material as the first insulating layer 14. In other embodiments, the second insulating layer may include a different dielectric material from that used in providing the first insulating layer 14. In one embodiment, the second insulating layer is composed of silicon oxide. The thickness of the second insulating layer can be from 5 nm to 10 nm, although lesser and greater thicknesses can be employed. The second insulating layer is then patterned, for example, using conventional lithography and dry etching processes to define a plurality of trenches 18 in the second insulating layer. The plurality of trenches 18 separate the adjacent rows of the metal anchors 16 from each other so that the metal anchors 16 in each row are confined in a corresponding trench 18 along a lengthwise direction of the trench 18. The trenches 18 expose metal anchors 16 for directing the assembly of the SWCNTs. In one embodiment, the trenches 18 may be formed as parallel strip-shaped trenches. Specifically, the second insulating layer can be patterned by first applying a photoresist (not shown) on the second insulating layer, exposing the photoresist to a pattern of radiation, and then developing the pattern into photoresist utilizing a resist developer. Once the patterning of the photoresist is completed, an etch step is performed to transfer the pattern from the patterned photoresist into the second insulating layer by, for example, RIE using the first insulating layer 14 as an etch stop. The width of the trenches 18 is configured such that a dispersion of the charged SWCNTs of the present application can be directed to flow through the trenches 18. In one embodiment, the width of the trenches 18 can be from 5 nm to 20 nm. Remaining portions of the second insulating layer that border the trenches 18 are herein referred to as guiding structures 20.

Figure 2A:
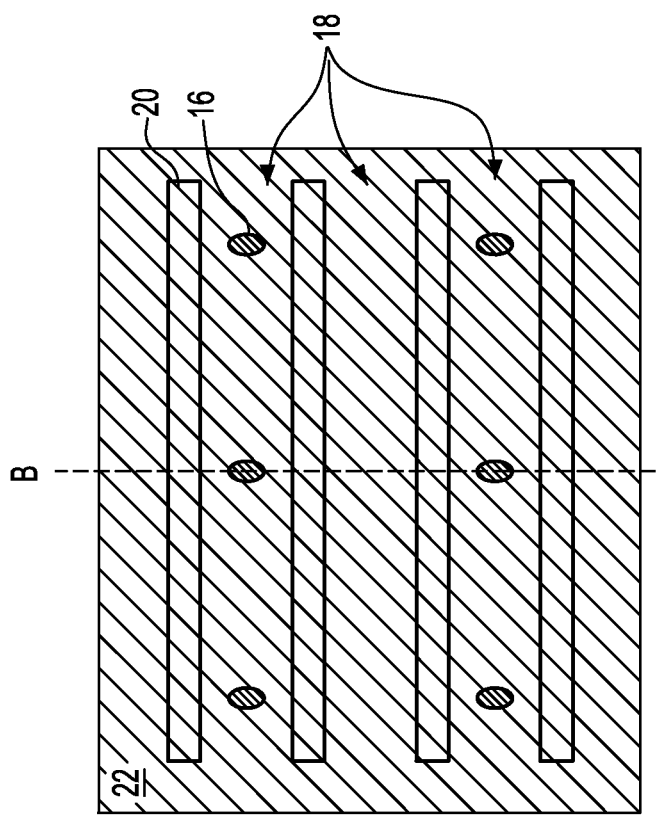
FIG. 2A is a top view of the semiconductor structure of FIG. 1A after forming a passivation layer.
Figure 2B:
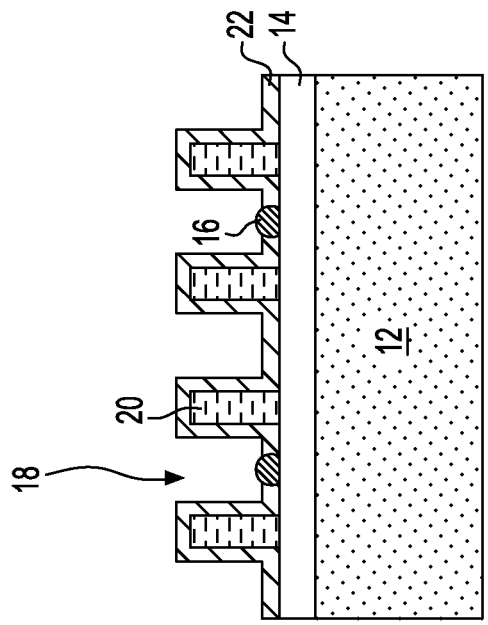
FIG. 2B is a cross-sectional view of the semiconductor structure of FIG. 2A along line B-B'.

Referring to FIGS. 2A-2B, a passivation layer 22 is formed on exposed surfaces of the first insulating layer 14 and the guiding structures 20 to prevent the absorption of the charged SWCNTs on theses undesired surfaces. Exemplary passivation agents that can be used in the passivation layer 22 include, but are not limited to, poly(ethylene glycol) (PEG) and PEG containing surfactants. The passivation layer 22 can be formed by depositing the passivation agent on the first insulating layer 14 and the guiding structures 20 by a coating process, such as, for example, spin coating, spray coating, or screen printing. The passivation layer 22 that is formed generally has a thickness ranging from 3 nm to 10 nm.

Referring to FIGS. 3A-3B, a dispersion 24 containing charged SWCNTs 26 having charged moieties ($R_1$) on sidewalls of the SWCNTs and surface binding groups ($R_2$) at opposite ends of the SWCNTs is directed to flow through the trenches 18. The charged moieties can be either positively charged or negatively charged. Exemplary charged moieties ($R_1$) that can be employed to functionalize the pristine SWCNTs include, but are not limited to, proteins, lipids, and DNA molecules. In one embedment, the charged moiety ($R_1$)

is a negatively charged poly(T) strand DNA. The surface binding groups ($R_2$) may include any functional group that shows a high affinity to the metal anchors 16 to promote the self-assembly of the charged SWCNTs 26 on the metal anchors 16. Exemplary surface binding groups ($R_2$) include, but are not limited to, thiol (—SH) and isontrile (—NC).

Figure 4:
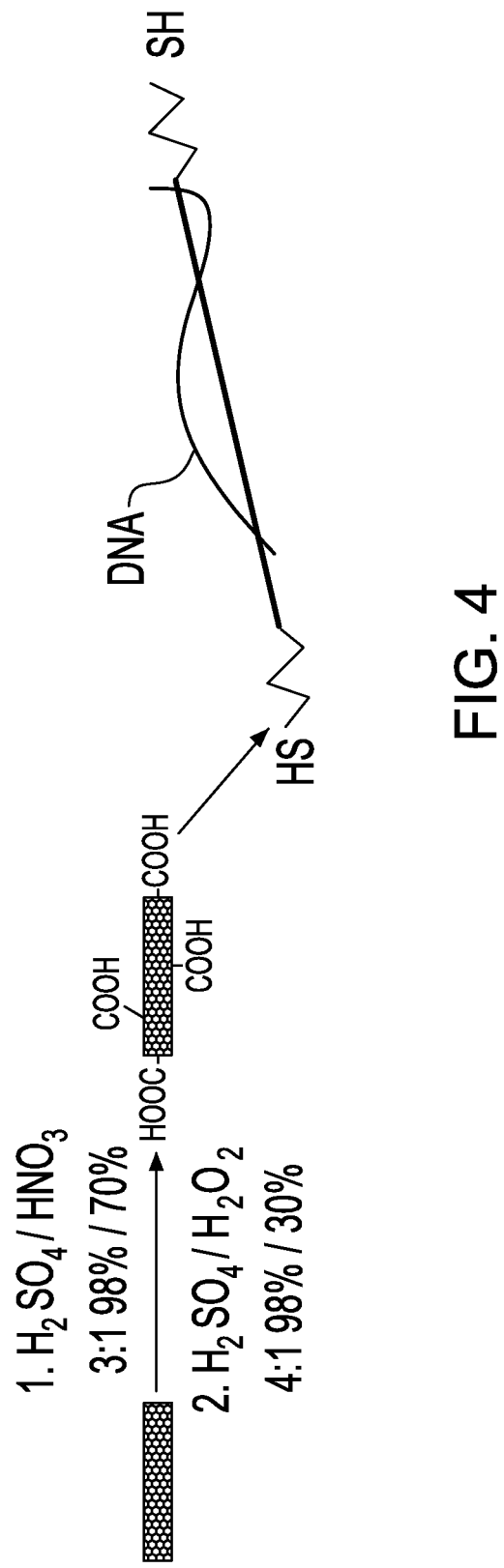
FIG. 4 is a schematic representation of covalent functionalization of a pristine SWCNT.

A specific example of functionalizing a pristine SWCNT to form a negatively charged SWCNT 26 with thiol groups at opposite ends of the negatively charged SWCNT is shown in FIG. 4. The pristine SWCNT is first carboxylated by an acid treatment using a $H_2SO_4$—$HNO_3$ solution. The carboxyl-functionalized SWCNT is then reacted with DNA molecules and thiol groups sequentially to covalently link the DNA molecules to sidewalls of the SWCNT and the thiol groups to opposite ends of the SWCNT.

Referring to FIGS. 5A-5B, during the directed flow of the dispersion 24, the strong specific binding between the surface binding groups ($R_2$) and the metal anchors 16 binds one end of the charged SWCNTs 26 to the metal anchors 16 on the substrate. The charge on the charged SWCNTs 26 keeps a sufficient distance between any two charged SWCNTs 26 in the dispersion 24. Thus, each metal anchor 16 can only connect to a single charged SWCNT 26.

Figure 6B:
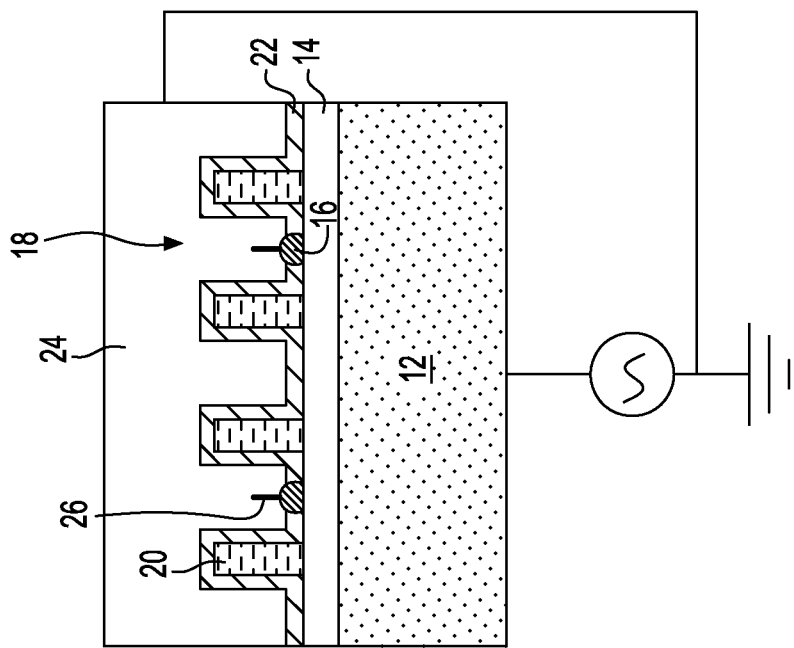
FIG. 6B is a cross-sectional view of the semiconductor structure of FIG. 6A along line B-B'.
Figure 6A:
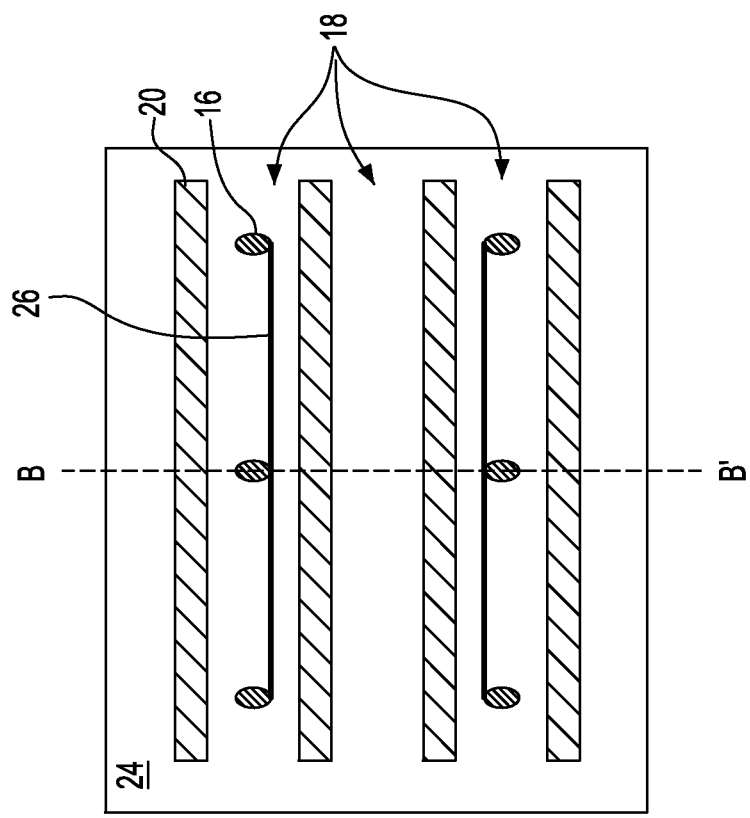
FIG. 6A is a top view of the semiconductor structure of FIG. 5A after subjecting the charged SWCNTs to an alternative current (AC) electric field such that the charged SWCNTs are aligned parallel to lengthwise directions of the trenches.

Referring to FIGS. 6A-6B, after one end of each of the charged SWCNTs 26 is attached to a corresponding metal anchor 16, an alternating current (AC) electric filed is applied between the base substrate 12 and the SWCNT dispersion 24, which is also grounded. AC electrical field alternatively attracts the charged SWCNTs 26 toward or repel them away from the base substrate 12 to facilitate the horizontal alignment of the charged SWCNTs 26 along lengthwise directions of the trenches 18. During this electrical field modulation process, the surface binding group ($R_2$) at another end of each of the charged SWCNTs 26 binds to another metal anchor 16 adjacent to the corresponding metal anchor 16. In one embodiment and when the charged SWCNTs 26 are functionalized with a negatively-charged DNA molecule, DNA-functionalized SWCNTs are aligned and connected between two adjacent metal anchors during positive potential interval. After the alignment of the charged SWCNTs 26, those charged SWCNTs 26 that are not bound to the metal anchors 16 can then be washed off from the substrate. The passivation layer 22 is then removed by rinsing with a dilute carboxylic acid aqueous solution to re-expose the first insulating layer 14 and the guiding structures 20.

Figure 7B:
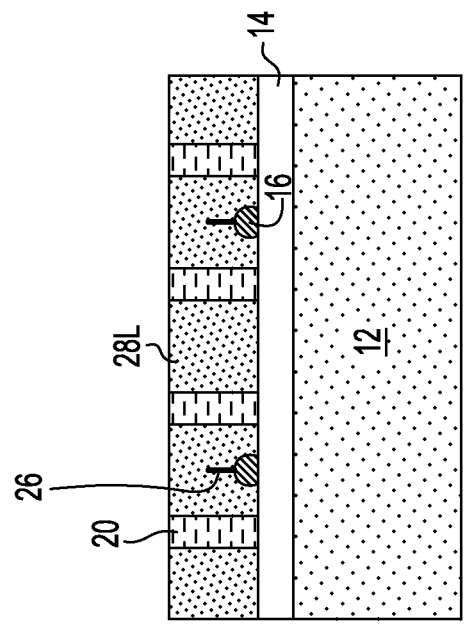
FIG. 7B is a cross-sectional view of the semiconductor structure of FIG. 7A along line B-B'.
Figure 7A:
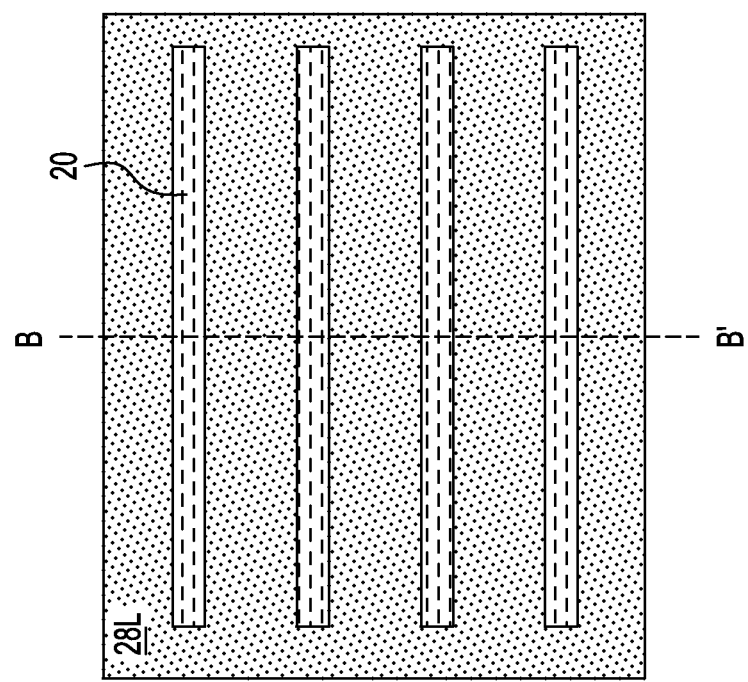
FIG. 7A is a top view of the semiconductor structure of FIG. 6A after forming an interlevel dielectric (ILD) layer over the substrate.

Referring to FIGS. 7A-7B, an interlevel dielectric (ILD) layer 28L is formed over the substrate covering the exposed surfaces of the first insulating layer 14, the metal anchors 16 and the charged SWCNTs 26 to fill the trenches 18. The ILD layer 28L includes a dielectric material that may be easily planarized. For example, the ILD layer 28L can be a doped silicate glass, an undoped silicate glass (silicon oxide), an organosilicate glass (OSG), or a porous dielectric material. The ILD layer 28L can be formed by CVD, PVD or spin coating. The thickness of the ILD layer 28 can be selected so that an entirety of the top surface of the ILD layer 28L is formed above top surfaces of the guiding structures 20. The ILD layer 28L can be subsequently planarized, for example, by CMP and/or a recess etch using the guiding structures 20 as an etch stop. After the planarization, the ILD layer 28L has a topmost surface coplanar with the topmost surfaces of the guiding structures 20.

Figure 8B:
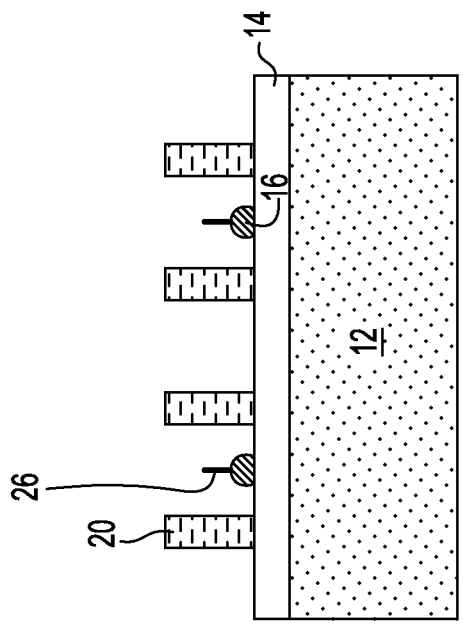
FIG. 8B is a cross-sectional view of the semiconductor structure of FIG. 8A along line B-B'.
Figure 8A:
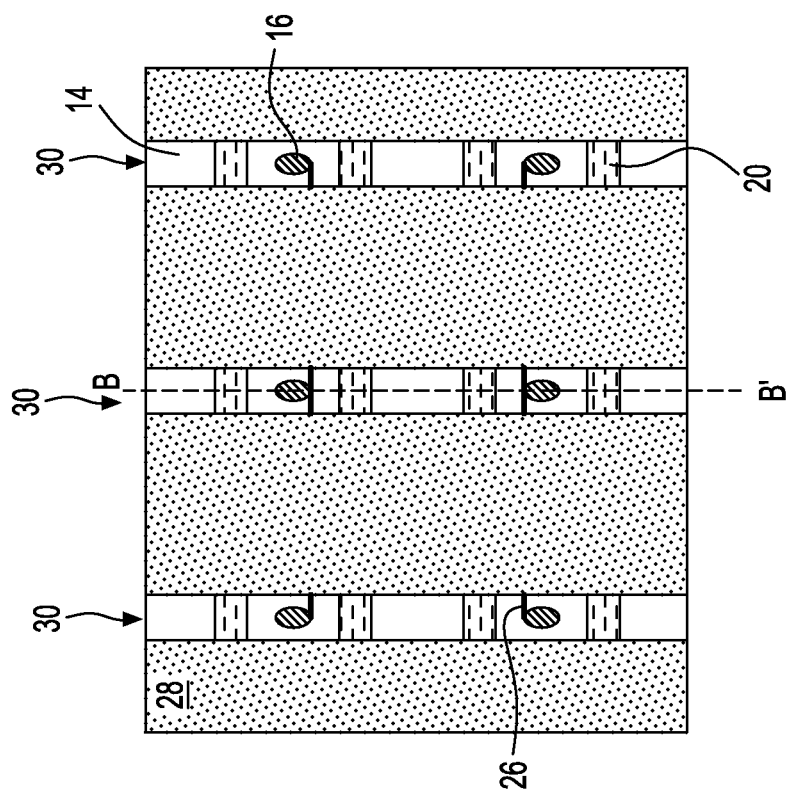
FIG. 8A is a top view of the semiconductor structure of FIG. 7A after forming first openings through the ILD layer to expose the metal anchors and portions of the charged SWCNTs adjacent to the metal anchors.

Referring to FIGS. 8A-8B, first openings 30 are formed through the ILD layer 28L to expose metal anchors 16 and portions of the charged SWCNTs 26 adjacent to the metal anchors 16. The first openings 30 can be forming by lithography and etching. The lithographic process includes forming a photoresist layer (not shown) on the top surface of the ILD layer 28L, exposing the photoresist layer to a desired pattern of radiation and developing the exposed photoresist layer utilizing a conventional resist developer. The etching process includes a dry etch, such as, for example, RIE or a wet chemical etch that selectively removes exposed portions of the ILD layer. After etching, the remaining portions of the photoresist layer can be removed by a conventional resist striping process, such as, for example, ashing. Remaining portions of the ILD layer 28L are herein referred to as the ILD layer portion 28.

Figure 9B:
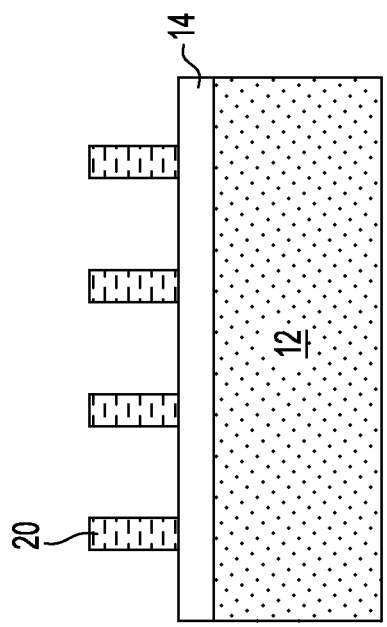
FIG. 9B is a cross-sectional view of the semiconductor structure of FIG. 9A along line B-B'.
Figure 9A:
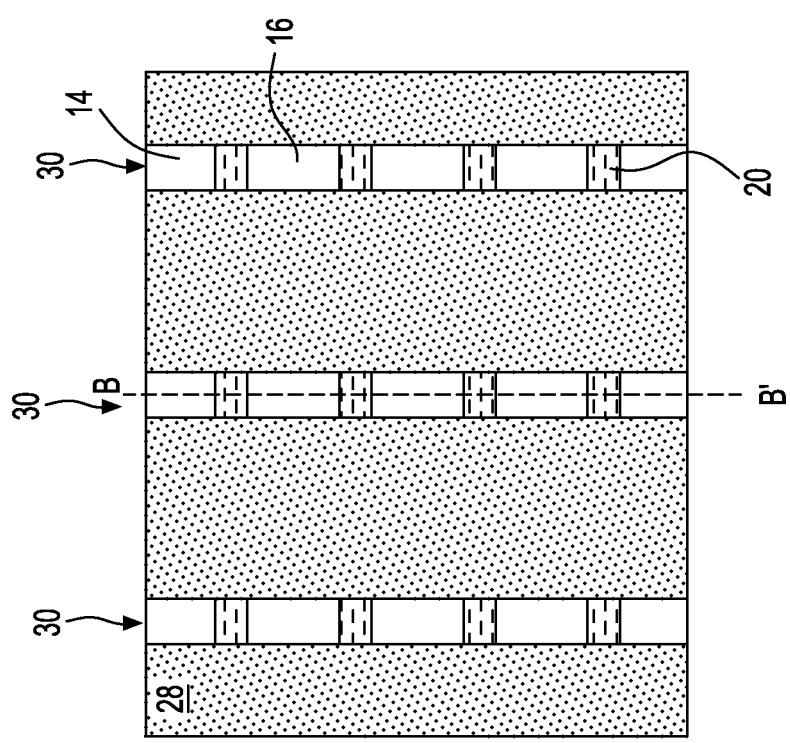
FIG. 9A is a top view of the semiconductor structure of FIG. 8A after removing the metal anchors and the portions of the charged SWCNTs adjacent to the metal anchors to provide functional SWCNT portions.

Referring to FIGS. 9A-9B, the metal anchors 16 and portions of the charged SWCNTs 26 exposed in the first openings 30 are removed by, for example, RIE. Remaining portions of the charged SWCNTs 26 that are covered by the ILD layer portion 28 are intact.

Figures 10A, 10B:
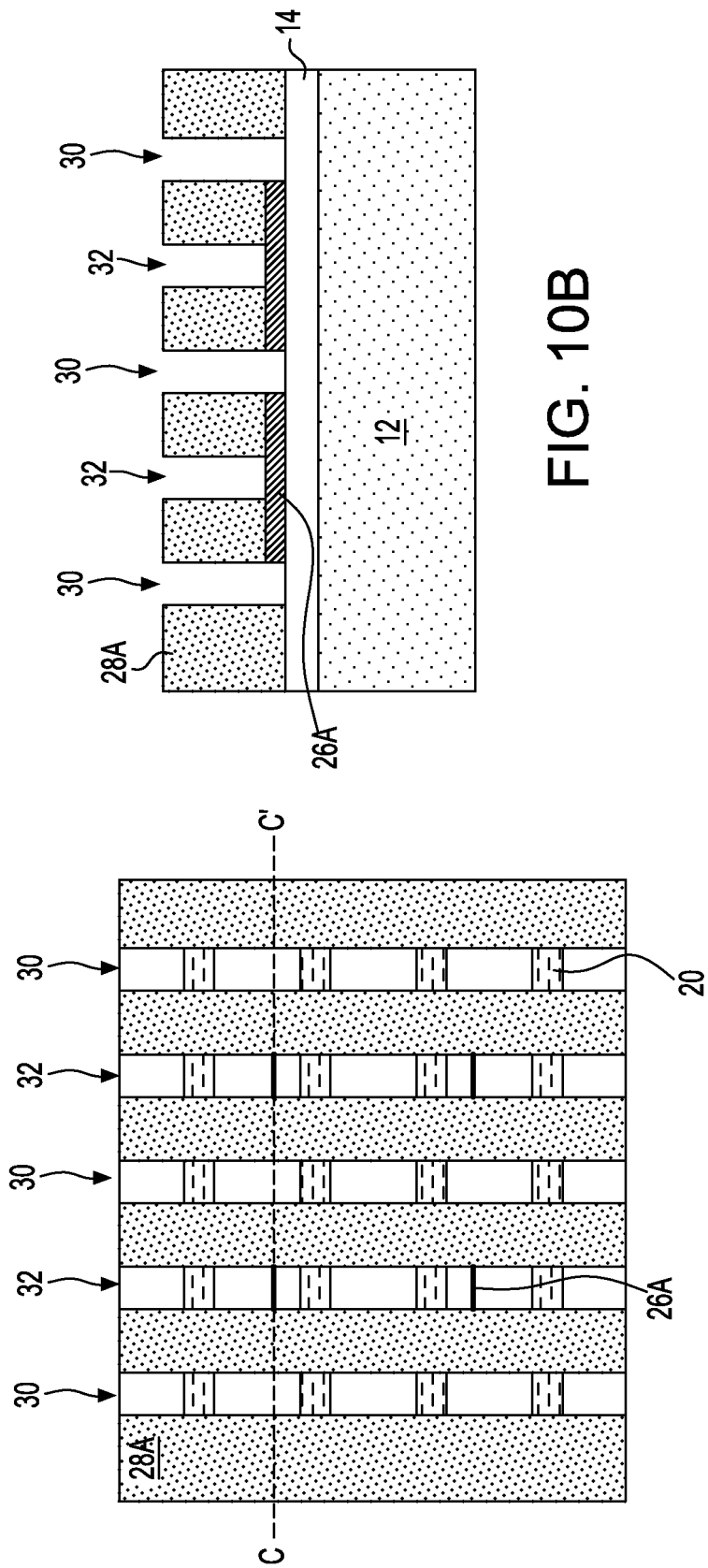
FIG. 10A is a top view of the semiconductor structure of FIG. 9A after forming second openings through the ILD layer to expose portions of the functional SWCNT portions.
FIG. 10B is a cross-sectional view of the semiconductor structure of FIG. 10A along line C-C'.

Referring to FIGS. 10A-10B, the ILD layer portions 28 are patterned to provide second openings 32 by standard lithography and etching processes described above with respect to forming the first openings 30. The second openings 32 expose portions of the remaining portions of the charged SWCNTs 26. The remaining portions of the charged SWCNTs 26 are herein referred to as functional SWCNT portions 26A. Remaining portions of the ILD layer portions 28 are herein referred to as patterned ILD layer portions 28A.

Referring to FIGS. 11A-11B, first gate structures 34 are formed in the first openings 30 and second gate structures 36 are formed in the second openings 32. Because the second gate structures 36 are formed over the exposed portions of the functional SWCNT portions 26A, the second gate structures 36 serve as functional gate structures. The term "functional gate structure" as used herein denotes a gate structure used to control output current (i.e., flow of carriers in the channel) of a semiconducting device through electrical or magnetic fields. Each of the first and the second gate structures 34, 36 includes, from bottom to top, a gate dielectric 38 and a gate electrode 40. The first and the second gate structures 34, 36 can be formed by first depositing a conformal gate dielectric layer (not shown) on bottom surfaces and sidewalls of the first gate openings 30, bottom surfaces and sidewalls of the second gate openings 32, and the top surface of the patterned ILD layer portion 28A. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the gate dielectric layer is composed of hafnium oxide ($HfO_2$). The gate dielectric layer can be formed by a conventional deposition process, including but not limited to, CVD, PVD, atomic layer deposition (ALD), molecular beam epitaxy (MBE), ion beam deposition, electron beam deposition, and laser assisted deposition. The gate dielectric layer that is formed may have a thickness ranging from 0.9 nm to 6 nm, with a thickness ranging from 1.0 nm to 3 nm being more typical. The gate dielectric layer may have an effective oxide thickness on the order of or less than 1 nm.

Remaining volumes of the first openings 30 and the second openings 32 are then filled with a gate electrode layer (not shown). The gate electrode layer can include any conductive material, such as, for example, polycrystalline silicon, polycrystalline silicon germanium, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the gate electrode layer is comprised of polycrystalline silicon.

The gate electrode layer can be formed utilizing a conventional deposition process including, for example, CVD, plasma enhanced chemical vapor deposition (PECVD), evaporation, PVD, sputtering, chemical solution deposition and ALD. When silicon-containing materials are used as the gate electrode layer, the silicon-containing materials can be doped with an appropriate impurity by utilizing either an in-situ doping deposition process or by utilizing deposition, followed by a step such as ion implantation or gas phase doping in which the appropriate impurity is introduced into the silicon-containing material. Portions of the gate electrode layer and the gate dielectric layer that are formed above the top surface of the patterned ILD layer portion 28A can be removed, for example, by CMP. The remaining portions of the gate dielectric layer constitute gate dielectric 38 and the remaining portions of the gate electrode layer constitute gate electrode 40.

Figure 12B:
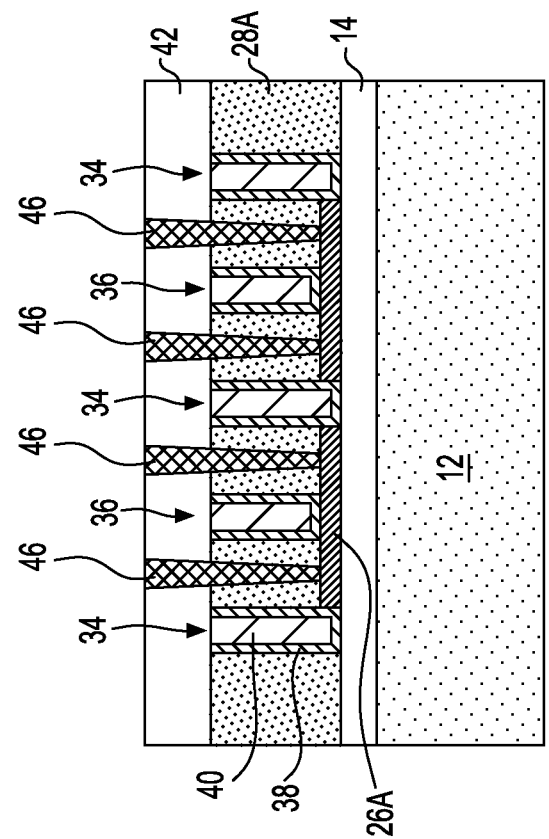
FIG. 12B is a cross-sectional view of the semiconductor structure of FIG. 12A along line C-C'.
Figure 12A:
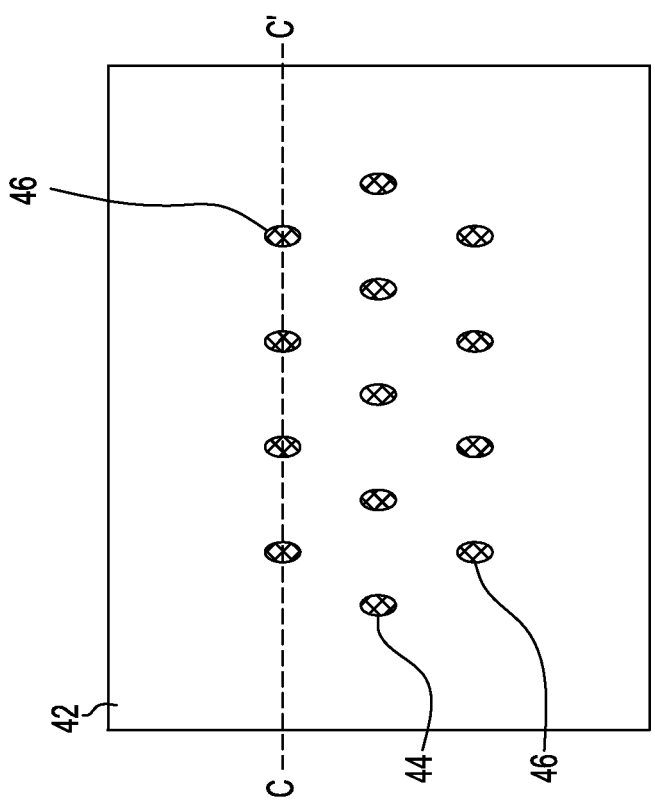
FIG. 12A is a top view of the semiconductor structure of FIG. 11A after forming gate contact structures and source/drain contact structures.

Referring to FIGS. 12A-12B, a contact-level dielectric layer 42 is deposited over the patterned ILD layer portions 28A, the first gate structures 34 and the second gate structures 36. The contact-level dielectric layer 42 can include a dielectric material such as undoped silicon oxide, doped silicon oxide, porous or non-porous organosilicate glass, porous or non-porous nitrogen-doped organosilicate glass, or a combination thereof. In some embodiments, the contact-level dielectric layer 42 may include a same dielectric material as the ILD layer 28L. In other embodiments, the contact-level dielectric layer 42 may include a different dielectric material from that used in providing the ILD layer 28L. The contact-level dielectric layer 42 can be formed by CVD, PVD or spin coating. If the contact-level dielectric layer 42 is not self-planarizing, the top surface of the contact-level dielectric layer 42 can be planarized, for example, by CMP.

Various contact structures including gate contact structures 44 in contact with the first gate structures 34 and the second gate structures 36, and source/drain contact structures 46 in contact with portions of the functional SWCNT portions 26A on opposite sides of each of the second gate structures 36 are formed. Various contact structures (44, 46) can be formed, for example, by forming gate contact openings (not shown) and source/drain contact openings (not shown) through the contact-level dielectric layer 42 using a combination of lithographic patterning and an anisotropic etch. The gate contact openings expose portions of gate electrode 40. The source/drain contact openings expose portions of the functional SWCNT portions 26A on opposite sides of each of the second gate structures 36. The gate contact openings and the source/drain contact openings are then filled with a conductive material using a conventional deposition process, such as, for example, CVD, PVD, ALD, or plating. Exemplary conductive materials include, but are not limited to, Cu, Al, W, Ti, Ta or their alloys. Excess portions of the conductive material above the contact-level dielectric layer 42 can be subsequently removed, for example, by a recess etch or CMP.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming a plurality of metal anchors and a plurality of trenches on a substrate, wherein the plurality of metal anchors are arranged in a matrix of rows and columns such that the metal anchors in each row are arranged in a corresponding trench along a lengthwise direction of the corresponding trench;
    directing a dispersion comprising a plurality of charged single-wall carbon nanotubes (SWCNTs) having a surface binding group on each end of the plurality of charged SWCNTs through the plurality of trenches, during which one end of each of the plurality of charged SWCNTs binds to a corresponding metal anchor; and
    subjecting the plurality of charged SWCNTs to an electric field, wherein the electric field aligns the plurality of charged SWCNTs parallel to lengthwise directions of the plurality of trenches such that another end of each of the plurality of charged SWCNTs binds to a metal anchor adjacent to the corresponding metal anchor.

2. The method of claim 1, wherein each of the plurality of charged SWCNTs comprises charged moieties surrounding sidewalls of each of the plurality of charged SWCNTs.

3. The method of claim 2, wherein the charged moieties are positively charged.

4. The method of claim 2, wherein the charged moieties are negatively charged.

5. The method of claim 4, wherein the charged moieties comprise proteins, lipids or DNA molecules.

6. The method of claim 1, wherein the surface binding group comprises thiol (—SH) or isontrile (—NC).

7. The method of claim 1, wherein each of the plurality of metal anchors comprises gold, silver, copper, chromium, aluminum, titanium, tungsten, or platinum.

8. The method of claim 1, wherein the electric field is an alternating current (AC) electric field.

9. The method of claim 1, wherein the substrate comprises a first insulating layer located on a base substrate.

10. The method of claim 9, wherein the first insulating layer comprises silicon oxide, hafnium oxide, or aluminum oxide.

11. The method of claim 10, wherein the forming the plurality of metal anchors and the plurality of trenches on the substrate comprise:
    forming a metal layer on the first insulating layer;
    patterning the metal layer to form the plurality of metal anchors;
    forming a second insulating layer on the substrate to cover the first insulating layer and the plurality of metal anchors; and
    patterning the second insulating layer to form the plurality of trenches, wherein each of the plurality of trenches exposes metal anchors in a corresponding row of the plurality of metal anchors.

12. The method of claim 11, wherein the second insulating layer comprises a dielectric oxide or a non-conductive polymer.

13. The method of claim 12, further comprising passivating exposed surfaces of the first insulating layer and remaining portions of the second insulating layer with a passivation agent.

14. The method of claim 13, wherein the passivation agent comprises poly(ethylene glycol) (PEG) or a PEG containing surfactant.

15. The method of claim 14, further comprising removing the passivation agent from the substrate to re-expose the exposed surfaces of the first insulating layer and the remaining portions of the second insulating layer.

16. The method of claim 15, further comprising removing the plurality of metal anchors and portions of the plurality of charged SWCNTs adjacent to the plurality of metal anchors from the substrate.

17. The method of claim 16, wherein the removing the plurality of metal anchors and the portions of the plurality of charged SWCNTs adjacent to the plurality of metal anchors from the substrate comprises:
- forming an interlevel dielectric (ILD) layer on the substrate, the ILD layer covering exposed surfaces of the first insulating layer, the plurality of metal anchors, the remaining portions of the second insulating layer and the plurality of charged SWCNTs; and
- patterning the ILD layer to provide first openings, the first openings exposing the plurality of metal anchors and the portions of the plurality of charged SWCNTs adjacent to the plurality of metal anchors.

18. The method of claim 17, wherein the removing the plurality of metal anchors and the portions of the plurality of charged SWCNTs adjacent to the plurality of metal anchors from the substrate is effected by reactive ion etch (RIE).

19. The method of claim 18, further comprising forming a functional gate structure on a portion of each of the plurality of charged SWCNTs.

20. The method of claim 19, wherein the forming the functional gate structure on the portion of each of the plurality of charged SWCNTs comprises:
- patterning remaining portions of the ILD layer to provide second openings, each of the second openings exposing a portion of each of the plurality of charged SWCNTs;
- forming a gate dielectric on sidewalls and a bottom surface of each of the second openings; and
- forming a gate electrode on the gate dielectric to fill a remaining volume of each of the second openings.

* * * * *